(12) United States Patent
Ogura

(10) Patent No.: US 6,181,629 B1
(45) Date of Patent: Jan. 30, 2001

(54) SEMICONDUCTOR MEMORY DEVICE INCORPORATING POTENTIAL GENERATION CIRCUIT WITH RAPID RISE OF OUTPUT POTENTIAL

(75) Inventor: Taku Ogura, Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/466,474

(22) Filed: Dec. 17, 1999

(30) Foreign Application Priority Data

Jun. 23, 1999 (JP) .................................................. 11-177207

(51) Int. Cl.$^7$ ....................................................... G11C 7/00
(52) U.S. Cl. .......................... 365/227; 365/226; 365/704; 365/189.09; 365/189.11
(58) Field of Search .................................. 365/226, 227, 365/189.09, 189.11, 204

(56) References Cited

U.S. PATENT DOCUMENTS

| | | | |
|---|---|---|---|
| 5,264,743 | * 11/1993 | Nakagome et al. | 307/473 |
| 5,347,492 | * 9/1994 | Horiguchi et al. | 365/226 |
| 5,394,077 | * 2/1995 | Atsumi | 323/223 |
| 5,394,365 | * 2/1995 | Tsukikawa | 365/189.09 |
| 5,526,313 | * 6/1996 | Itoh et al. | 365/205 |
| 5,544,102 | * 8/1996 | Tobita et al. | 365/189.09 |
| 5,561,385 | * 10/1996 | Choi | 327/536 |
| 5,805,508 | * 9/1998 | Tobita | 365/189.09 |
| 6,002,354 | * 12/1999 | Itoh et al. | 341/144 |
| 6,008,690 | * 12/1999 | Takeshima et al. | 327/534 |
| 6,031,779 | * 2/2000 | Takahashi et al. | 365/226 |

FOREIGN PATENT DOCUMENTS

409082917A * 3/1997 (JP) .

* cited by examiner

*Primary Examiner*—Viet Q. Nguyen
(74) *Attorney, Agent, or Firm*—McDermott, Will & Emery (57) ABSTRACT

A positive voltage generation circuit used in data erasure and programming with respect to a memory cell includes a positive voltage charge pump circuit generating a voltage higher than the power supply voltage, and a decouple capacitor. When the positive voltage charge pump is rendered inactive, the decouple capacitor is disconnected from an output node by a P channel MOS transistor prior to the fall of the potential at the output node. The decouple capacitor is connected to the output node again when the positive voltage charge pump is rendered active. Since the potential of the output node does not have to be boosted from the beginning by virtue of charge redistribution, power consumption can be reduced correspondingly.

8 Claims, 12 Drawing Sheets

|  | PROGRAMMING ||  ERASURE || READ OUT |
|---|---|---|---|---|---|
|  | HIGH VOLTAGE PULSE APPLICATION | VERIFY | HIGH VOLTAGE PULSE APPLICATION | VERIFY |  |
| PPUMPE | H | L | H | L | L |
| NPUMPE | H | L | H | L | L |
| CXHRDY | L | L | L | L | H |

FIG.3

| | WL | | SG | | WELL | | PAGE BUFFER |
|---|---|---|---|---|---|---|---|
| | SELECT | NONSELECT | SELECT | NONSELECT | SELECT | NONSELECT | |
| PROGRAMMING | Vout- | GND | Vout+ | GND | GND | GND | Vout+ |
| ERASURE | Vout+ | GND | Vout- | GND | Vout- | GND | Vcc |
| READ OUT | VwL | GND | VwL | GND | GND | GND | Vcc |

SEMICONDUCTOR MEMORY DEVICE INCORPORATING POTENTIAL GENERATION CIRCUIT WITH RAPID RISE OF OUTPUT POTENTIAL

BACKGROUND OF THE INVENTION

1. Field of the Invention

The present invention relates to semiconductor memory devices, and more particularly, to a semiconductor memory device including a voltage generation circuit.

2. Description of the Background Art

Memories referred to as nonvolatile memories are known as one type of a semiconductor memory device. A flash memory is representative of such a nonvolatile memory that can program data electrically. In this flash memory, a constant high voltage is required at the time of programming and erasing. This high voltage is generated by boosting internally an externally applied power supply voltage in most cases. Control is provided so that a desired voltage is applied to the memory cell according to the operation mode.

For example, in a write operation, a write pulse apply period applying a write pulse corresponding to externally applied data, and a verify period to determine whether the threshold voltage of the memory cell has arrived at a desired level after the write pulse is applied to the memory cell are repeated alternately.

In the write pulse apply period, a charge pump circuit in the semiconductor memory device is rendered active, whereby a high voltage for writing is generated. The power consumption of the charge pump circuit during the boosting operation may become so great as to occupy a large ratio of the entire power consumption of the chip, which cannot be ignored.

For the purpose of reducing power consumption of the charge pump circuit, various measures have been taken such as reducing the number of stages forming the charge pump or employing mat division to reduce the load capacitance connected to the output of the charge pump circuit.

Figure 11:
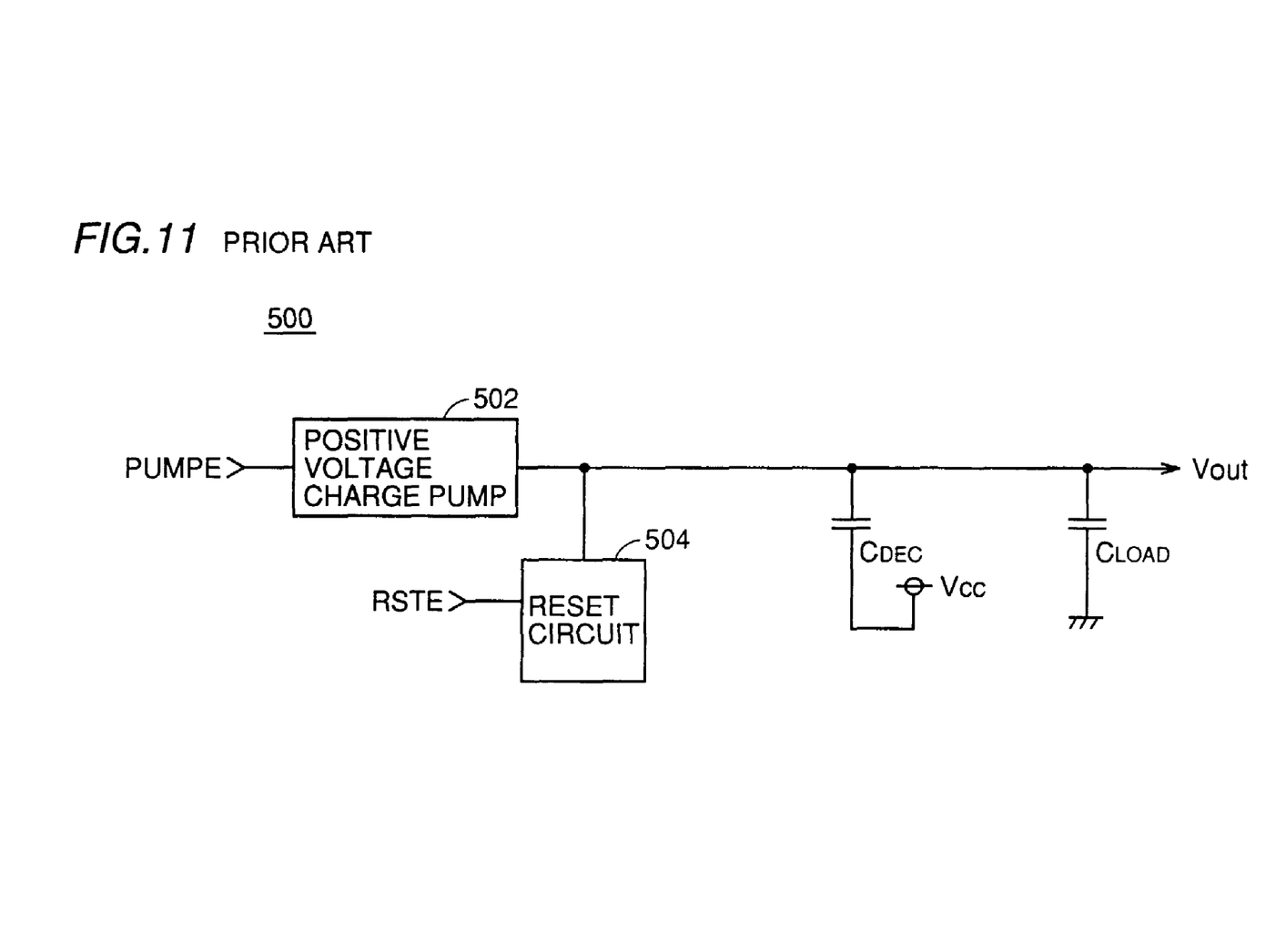
FIG. 11 is a circuit diagram showing a structure of a voltage generation circuit in a conventional semiconductor memory device.

FIG. 11 is a circuit diagram showing a structure of a voltage generation circuit in a conventional semiconductor memory device.

Referring to FIG. 11, a voltage generation circuit 500 includes a positive voltage charge pump 502 activated in response to a charge pump activation signal PUMPE to boost an output potential Vout, a reset circuit 504 to set the level of output potential Vout to the level of a power supply potential Vcc according to a reset signal RSTE, and a decouple capacitor $C_{DEC}$ coupled between the output node of output potential Vout and the power supply node to which power supply potential Vcc is supplied. Since a circuit that becomes the load is connected between the output node of voltage generation circuit 500 and the ground node, a load capacitance $C_{LOAD}$ is depicted as the capacitance equivalent to this circuit.

Figure 12:
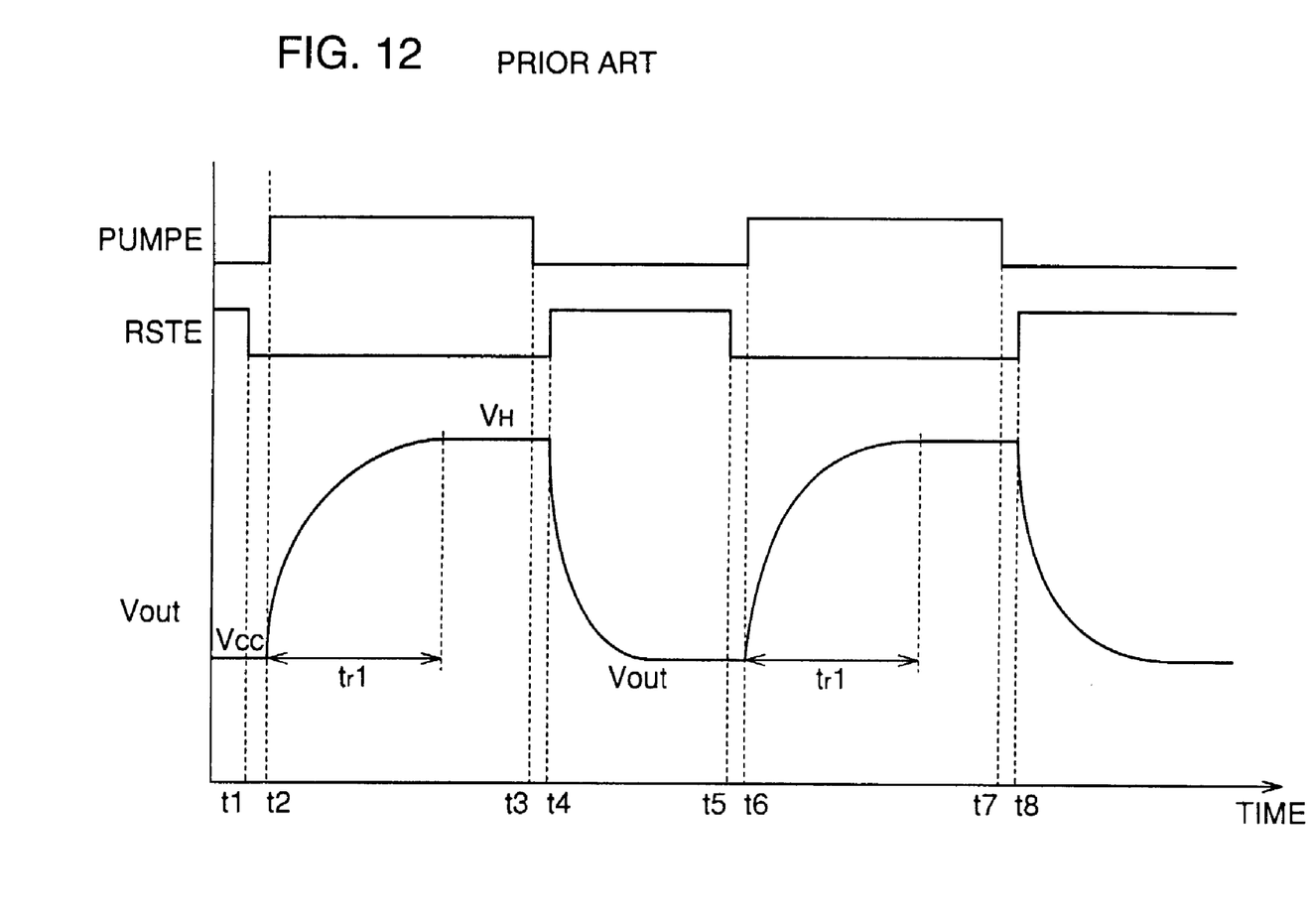
FIG. 12 is an operation waveform diagram to describe the operation of a voltage generation circuit 500 of FIG. 11.

FIG. 12 is an operation waveform diagram to describe the operation of voltage generation circuit 500 of FIG. 11.

Referring to FIGS. 11 and 12, reset circuit 504 couples the output node of positive voltage charge pump 502 to power supply potential Vcc by reset signal RSTE before time t1. This state is referred to as "reset state".

At time t1, reset signal RSTE is pulled down to an L level (logical low), and the reset state is canceled. At time t2, charge pump activation signal PUMPE is pulled up to an H level (logical high), whereby positive voltage charge pump 502 is rendered active. As a result, output potential Vout is gradually raised to a predetermined high potential. At the elapse of a rising time tr1 from time t2, output potential Vout arrives at the level of a predetermined high potential VH.

Then, data is written.

Following a proper data write operation, positive voltage charge pump 502 is rendered inactive during the verify period in which determination is made whether the threshold voltage of the memory cell has arrived at a desired level or not. More specifically, at time t3, charge pump activation signal PUMPE is pulled down to an L level. At time t4, reset signal RSTE is pulled up to an H level, whereby the output node is coupled to power supply potential Vcc by reset circuit 504. The charge accumulated in decouple capacitor $C_{DEC}$ and load capacitance $C_{LOAD}$ is discharged to the power supply node by reset circuit 504.

When in the data writing operation or when data writing is insufficient, reset signal RSTE is canceled again at time t5. At time t6, charge pump activation signal PUMPE is rendered active again. Potential Vout attains the level of high potential VH at the elapse of a rising time tr1.

At time t7, charge pump activation signal PUMPE is rendered inactive. At time t8, reset signal RSTE is rendered active again to enter the verify period.

In the repetition of the boosting operation, the conventional boosting by a charge pump is initiated from the state where the output node is coupled to power supply potential Vcc by reset circuit 504. Therefore, rising time tr1 which is the period of time arriving at the level of high potential VH is equal to the case of boosting from the initial state, and is always constant. Power consumption of the charge pump circuit is greatest when output potential Vout is boosted from the level of power supply potential Vcc to high potential VH. A long period of time of this rise operation means that power consumption is increased accordingly. Also, it becomes a factor in inducing increase of the operation time required in data writing.

In the structure of the power supply including the charge pump circuit, control is provided so that the high potential generated at the charge pump circuit attains a predetermined constant potential by a detection circuit in order to apply a desired voltage to the memory cell. In general, a decouple capacitor $C_{DEC}$ is connected at the output node of the charge pump circuit in order to smooth the potential controlled by the detection circuit.

In the conventional circuit structure, the output node is reset every time the charge pump circuit is rendered inactive in the verify period, as described with reference to FIGS. 11 and 12. Therefore, the charge stored at decouple capacitor $C_{DEC}$ was discharged every time, inducing the problem of great power consumption.

SUMMARY OF THE INVENTION

An object of the present invention is to speed up the rising time of boosted potential to reduce power consumption and operation time.

According to an aspect of the present invention, a semiconductor memory device includes a potential generation circuit, a switch circuit, a potential stabilization circuit, and a storage unit.

The potential generation circuit applies a predetermined potential to an internal node. The switch circuit has one end connected to the internal node, and attains a conductive state when the potential generation circuit is rendered active, and attains a nonconductive state when the potential generation circuit is rendered inactive. The potential stabilization circuit is connected to the other end of the switch circuit to stabilize the potential of the internal node when the potential generation circuit is rendered active. The potential stabilization circuit maintains a predetermined potential when the potential generation circuit is rendered inactive. The storage unit receives the potential of the internal node to write data.

A main advantage of the present invention is that the potential stabilization circuit maintains the stored energy for reuse in the next voltage generation, so that the rising time can be shortened to reduce the operation time and power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings. In the drawings, the same reference characters are allotted to the same or corresponding elements.

[First Embodiment]

Figure 1:
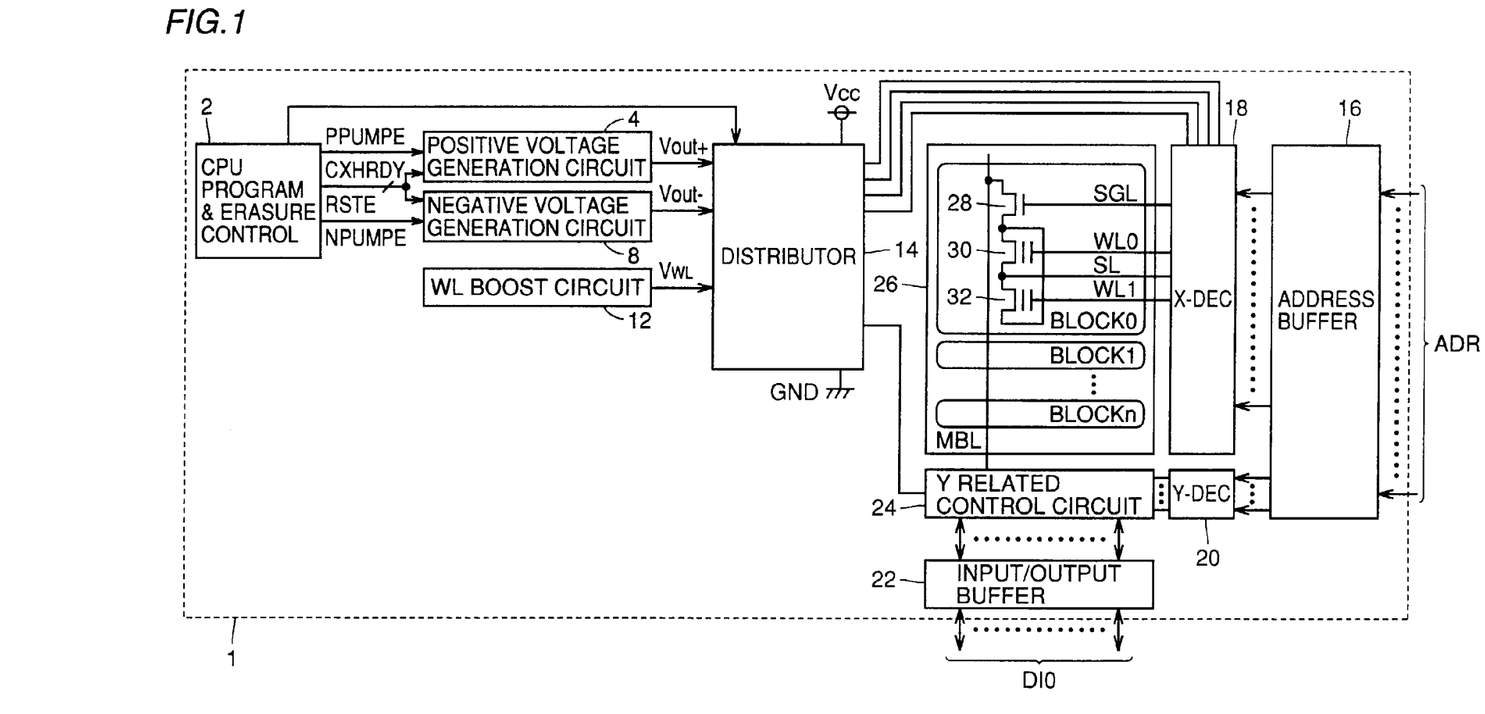
FIG. 1 is block diagram showing a schematic structure of a semiconductor memory device 1 of the present invention.

Referring to FIG. 1, a semiconductor memory device 1 of the first embodiment includes a CPU 2 providing control of programming and erasing using an internal ROM according to a program code stored in the ROM, a positive voltage generation circuit 4 receiving a standby signal CXHRDY, a charge pump activation signal PPUMPE, and a reset signal RSTE from CPU 2 to generate a corresponding output potential Vout+, a negative voltage generation circuit 8 receiving standby signal CXHRDY, reset signal RSTE, and a charge pump activation signal NPUMPE to generate an output potential Vout−, a WL boost circuit 12 generating a potential $V_{WL}$, and a distributor 14 receiving and distributing to each internal circuit output potentials Vout+, Vout− and $V_{WL}$ under control of CPU 2.

Semiconductor memory device 1 further includes an address buffer 16 receiving an address signal ADR, an X decoder 18 receiving an address signal from address buffer 16 and a potential from distributor 14 to determine each potential of a select gate SGL, word lines WL0 and WL1, a source line SL and a well, an input/output buffer 22 to input/output a data input/output signal DIO, an Y decoder 20 receiving and decoding the address signal from address buffer 16, and an Y related control circuit 24 corresponding to data input/output signal DIO according to the output of Y decoder 20 to apply a high voltage to a main bit line MBL.

Although not shown, X decoder 18 includes a WL decoder to select a word line, a SG decoder to select a select gate, a WELL decoder to select a well region corresponding to the selected memory block, and an SL decoder to select a source line.

Y related control circuit 24 includes a YG & sense amplifier selecting a column and effecting a readout operation with the sense amplifier in a readout operation, and a page buffer with a latch circuit to determine whether to apply a high voltage to main bit line MBL or not in a write operation according to the latched data.

WL boost circuit 12 functions to generate a boosted voltage that is applied to the selected word line WL and selected select gate SG in a read out operation to realize high speed access.

Semiconductor memory device 1 further includes a memory array 26. Memory array 26 includes memory blocks BLOCK0–BLOCKn, each formed in separated wells.

Memory block BLOCK0 includes memory cells 30 and 32, and a select gate 28. In memory block BLOCK0, a memory cell corresponding to select gate line SGL, word lines WL0 and WL1 and source line SL selected by X decoder 18 is selected to receive a signal corresponding to the data from main bit line MBL for data storage. In FIG. 1, memory cells 30 and 32 and select gate 28 corresponding to selected select gate line SGL, word lines WL0 and WL1 and source line SL are depicted representatively.

Figure 2:
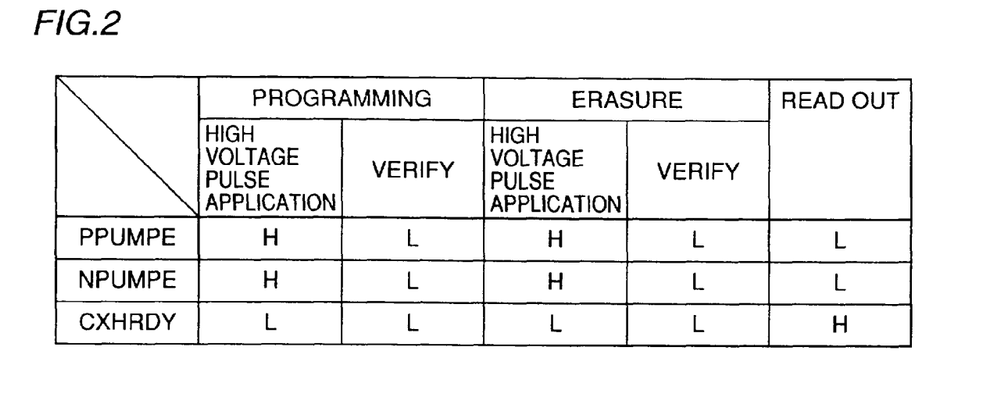
FIG. 2 is a diagram to describe a control signal output corresponding to each operation from a CPU 2 of FIG. 1.

FIG. 2 is a diagram to describe control signals output from CPU 2 of FIG. 1 corresponding to various operations.

Referring to FIGS. 1 and 2, the charge pump in positive voltage generation circuit 4 and the charge pump in negative voltage generation circuit 8 are rendered active only when a high voltage pulse is applied during a program operation and an erase operation. Therefore, in both the cases of a program operation and an erase operation, pump enable signals PPUMPE and NPUMPE are both at an H level when a high voltage pulse is applied, and at an L level when in a verify period. Signal CXHRDY attains an L level to notify the user that the semiconductor memory device is internally operating in a program operation and an erase operation accompanying the operation of CPU 2. Signal CXHRDY attains an H level when the operation of CPU 2 is not involved as in a readout operation.

Figure 3:
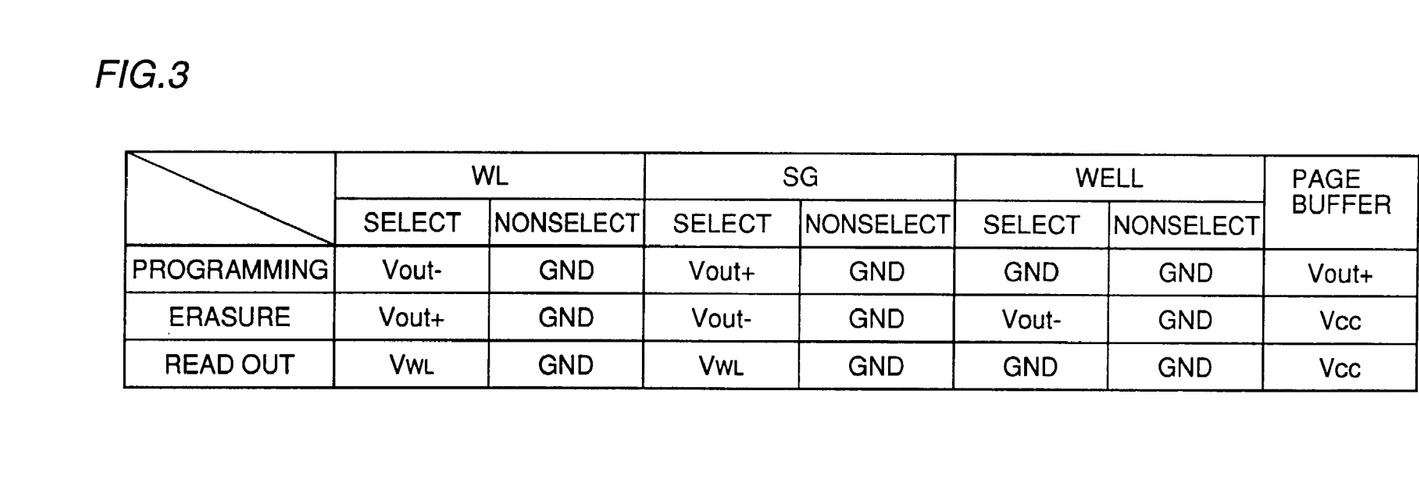
FIG. 3 is a diagram to describe the operation of a distributor 14 of FIG. 1.

FIG. 3 is a diagram to described an operation of distributor 14 of FIG. 1.

Referring to FIGS. 1 and 3, potentials Vout+, Vout− and ground potential are supplied to X decoder 18 by distributor 14 in the data programming operation in FIG. 3. The label of GND implies that the ground potential is applied. X decoder 18 applies potential Vout− to a word line WL that is selected according to address signal ADR, and applies the ground potential to a word line WL that is not selected.

Similarly, X decoder 18 applies potential Vout+ to a select gate line SGL corresponding to a selected select gate, and the ground potential to a select gate line SGL corresponding to a non-selected select gate. X decoder 18 sets all the wells corresponding to each block to the ground potential in data programming.

The page buffer included in Y related control circuit 24 receives potential Vout+ from distributor 14 to apply the same to main bit line MBL according to the data when data is to be written into a memory cell.

The operation in data erasure will be described here.

Distributor 14 applies potentials Vout+, Vout− and the ground potential to X decoder 18. X decoder 18 applies potential Vout+ to a word line WL that is selected according to address signal ADR and the ground potential to a word line WL that is not selected.

Similarly, X decoder 18 applies potential Vout− to a select gate line SGL corresponding to a selected select gate according to address signal ADR, and ground potential to a select gate line SGL corresponding to a select gate that is not selected.

X decoder 18 outputs potential Vout− as the well potential of the memory block in which data erasure is carried out, and applies ground potential to the well of a block that is not selected for erasure, i.e. in which data is not erased.

Distributor 14 applies power supply potential Vcc to Y related control circuit 24. The page buffer in Y related control circuit 24 applies power supply potential Vcc to main bit line MBL.

The operation in data read out will be described hereinafter. In a read out operation, positive voltage generation circuit 4 and negative voltage generation circuit 8 are rendered inactive. Distributor 14 applies potential $V_{WL}$ output from WL boost circuit 12 to X decoder 18.

X decoder 18 applies potential $V_{WL}$ to a word line WL that is selected for data readout and ground potential to a word line WL that is not selected.

X decoder 18 applies potential $V_{WL}$ to a select gate line SGL corresponding to a selected select gate, and the ground potential to a select gate line SGL that is not selected. In data reading, the well of each memory block is set at the ground potential.

Distributor 14 applies power supply potential Vcc to Y related control circuit 24 in data reading. Y related control circuit 24 applies power supply potential Vcc to main bit line MBL.

Figure 4:
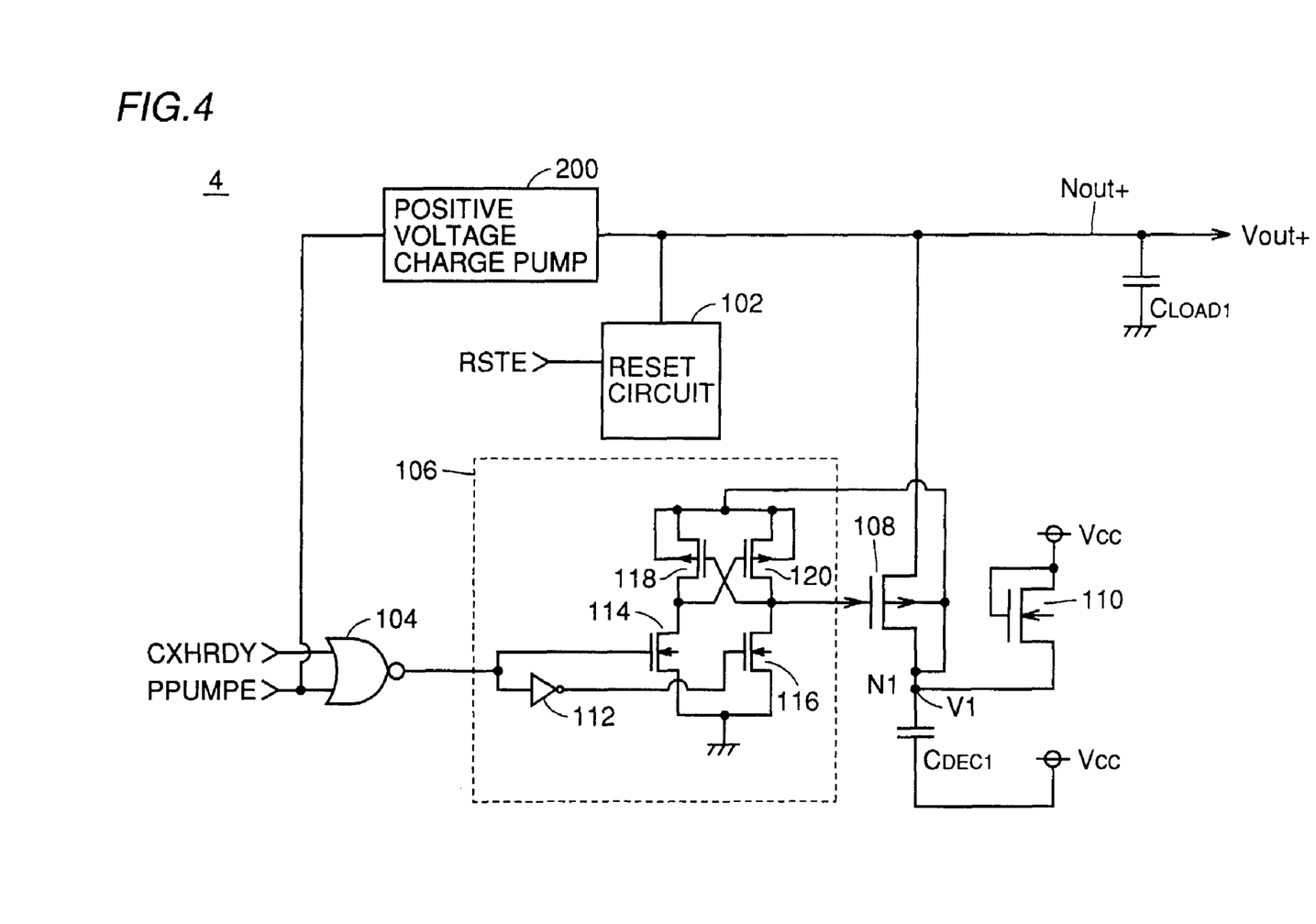
FIG. 4 is a circuit diagram showing a structure of a positive voltage generation circuit 4 of FIG. 1.

Referring to FIG. 4, positive voltage generation circuit 4 includes an NOR circuit 104 receiving charge pump activation signal PPUMPE and signal CXHRDY, a positive voltage charge pump circuit 200 rendered active by charge pump activation signal PPUMPE to boost the potential of a node Nout+, a reset circuit 102 rendered active by reset signal RSTE to couple node Nout+ to power supply potential Vcc, a level conversion circuit 106 receiving and converting the level of the output of NOR circuit 104, a P channel MOS transistor 108 receiving the output of level conversion circuit 106 at its gate, and connected between nodes Nout+ and N1, an N channel MOS transistor 110 connected between node N1 and the power supply node to which power supply potential Vcc is applied, and having its gate connected to the power supply node, and a decouple capacitor $C_{DEC1}$ connected between node N1 and the power supply node. Output potential Vout+ of positive voltage generation circuit 4 is provided from node Nout+ which is the output node of positive voltage generation circuit 4.

Node Nout+ is connected to load capacitance $C_{LOAD1}$ corresponding to distributor 14 and the like shown in FIG. 1.

Level conversion circuit 106 includes an inverter 112 receiving and inverting the output of NOR circuit 104, an N channel MOS transistor 116 having a source connected to the ground node, and receiving the output of inverter 112 at its gate, an N channel MOS transistor 114 having its source connected to the ground node, and receiving the output of NOR circuit 104 at its gate, a P channel MOS transistor 118 connected between node N1 and the drain of N channel MOS transistor 114, and having the drain of N channel MOS transistor 116 connected to its gate, and a P channel MOS transistor 120 connected between node N1 and the drain of N channel MOS transistor 116, and having the drain of N channel MOS transistor 114 connected to its gate.

The backgate of P channel MOS transistor 118 and the backgate of P channel MOS transistor 120 are connected to node N1.

The output signal of level conversion circuit 106 is provided from the drain of N channel MOS transistor 116. The backgate of P channel MOS transistor 108 is connected to node N1. By this connection, the potential difference between the gate and source of the P channel MOS transistor can be always set to 0 when level conversion circuit 106 provides an output of an H level. Also, the change in the threshold value caused by the substrate bias effect does not have to be taken into account independent of the potential of node N1 since the potential of the well region where the P channel MOS transistor is formed, i.e., the potential of the backgate of P channel MOS transistor 108, is equal to that of the source.

The difference from the conventional case is that a P channel MOS transistor 108 for switching is interposed between output node Nout and decouple capacitor $C_{DEC1}$. Control of the conductive/non-conductive state of P channel MOS transistor 108 is provided by signal CXHRDY and charge pump enable signal PPUMPE.

Signal CXHRDY is at an H level when in the standby state, and at an L level when in a programming or erasing state. Charge pump activation signal PPUMPE is at an H level and an L level when the charge pump is rendered active and inactive, respectively. Reset signal RSTE renders reset circuit 102 active and inactive when at an H level and an L level, respectively.

Figure 5:
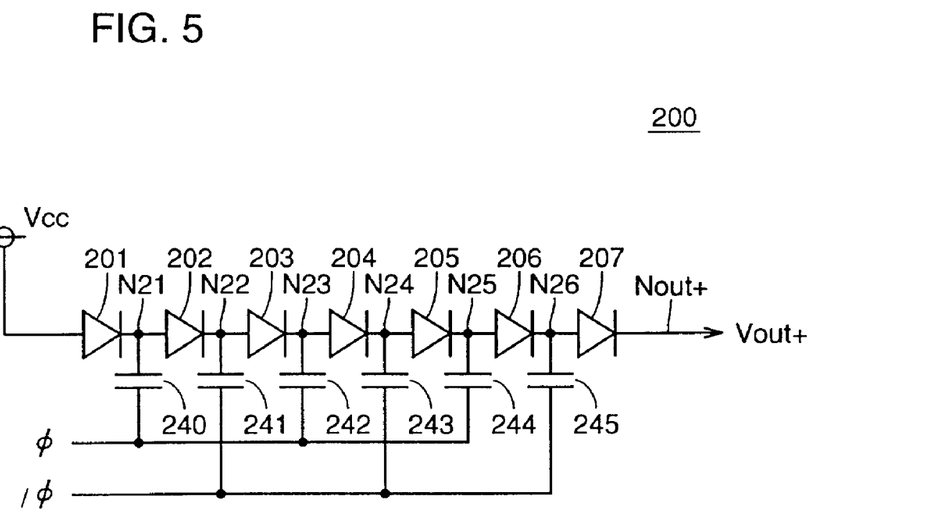
FIG. 5 is a circuit diagram showing a structure of a positive voltage charge pump circuit 200 of FIG. 4.

FIG. 5 is a circuit diagram showing a structure of positive voltage charge pump circuit 200 of FIG. 4.

Although not shown in FIG. 4, clock signals φ and /φ are applied to positive voltage charge pump circuit 200 according to activation of charge pump enable signal PPUMPE.

Referring to FIG. 5, positive voltage charge pump circuit 200 includes a diode 201 having its anode coupled to power supply potential Vcc and its cathode connected to a node N21, a diode 202 having its anode and cathode connected to nodes N21 and N22, respectively, a diode 203 having its anode and cathode connected to nodes N22 and N23, respectively, a diode 204 having its anode and cathode connected to nodes N23 and N24, respectively, a diode 205 having its anode and cathode connected to nodes N24 and N25, respectively, a diode 206 having its anode and cathode connected to nodes N25 and N26, respectively, and a diode 207 having its anode connected to node N26 and its cathode connected to node Nout+.

Node Nout+ is the output node of positive voltage charge pump circuit 200. Boosted potential Vout+ which is the output potential is provided from node Nout+.

Positive voltage charge pump circuit 200 further includes a capacitor 240 connected between a clock node to which a clock signal φ is applied and node N21, a capacitor 241 connected between a complementary clock node to which a complementary clock signal /φ is applied and node N22, a capacitor 242 connected between the clock node and node N23, a capacitor 243 connected between the complementary clock node and node N24, a capacitor 244 connected between the clock node and node N25, and a capacitor 245 connected between the complementary clock node and node N26.

Diode-connected MOSFETs, for example, are employed for diodes 201–207 shown in FIG. 5.

Figure 6:
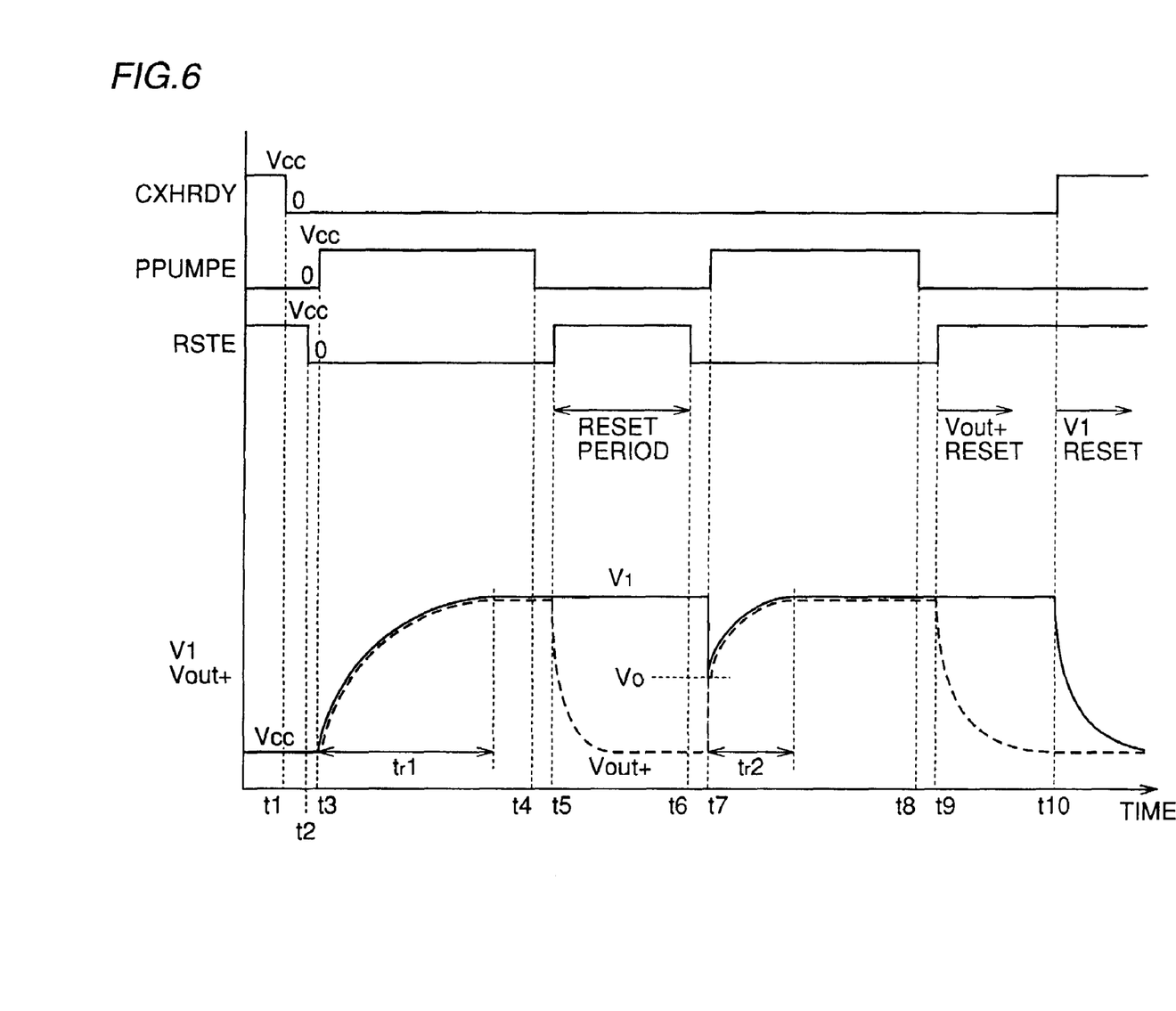
FIG. 6 is an operation waveform diagram to describe the operation of positive voltage generation circuit 4 of FIG. 4.

FIG. 6 is an operation waveform diagram to describe the operation of positive voltage generation circuit 4 of FIG. 4.

At time t1, the semiconductor memory device enters a program.erasure mode from a standby mode. At time t2, reset signal RSTE is driven down, whereby reset circuit 102 is rendered inactive.

At time t3, charge pump activation signal PPUMPE is pulled up to an H level. The charge pump circuit to generate a high voltage for programming.erasure is rendered active. Here, P channel MOS transistor 108 is conducting. Therefore, potential V1 of node N1 is boosted simultaneous to output voltage Vout+.

At time t4, positive voltage charge pump 200 is rendered inactive according to the fall of charge pump activation signal PPUMPE. At the same time, P channel MOS transistor 108 is rendered nonconductive, whereby decouple capacitor CDEC1 is disconnected from reset circuit 102.

At time t5, reset circuit 102 is rendered active in response to the rise of reset signal RSTE1. Output potential Vout+ falls to the level of power supply potential Vcc. As a result, the reset state is attained. Potential V1 maintains its boosted level for a while since node N1 is disconnected from reset circuit 102.

At time t6, reset circuit 102 is rendered inactive. At time t7, positive voltage charge pump 200 is rendered active. At the same time, P channel MOS transistor 108 is rendered conductive.

At time t7, the charge accumulated in decouple capacitor $C_{DEC1}$ is redistributed to load capacitance $C_{LOAD1}$, whereby output potential Vout+ rises at a high speed. Assuming that output potential Vout+ after charge redistribution becomes V0 at time t7, the following equation is obtained.

$$V0 = (C_{DEC1}/(C_{DEC1}+C_{LOAD1})) \times V1 + C_{LOAD1}/(C_{DEC1}+C_{LOAD1}) \times Vcc \quad (1)$$

By inserting $C_{DEC1}$=300 pF, $C_{LOAD1}$=300 pF, Vcc=3.3V, V1=10V into equation (1), for example, V0 is approximately 6.65V.

At time t7, the charge accumulated in decouple capacitor $C_{DEC1}$ is redistributed to load capacitance $C_{LOAD1}$, whereby output potential Vout+ rises speedily. Accordingly, the rising time of output potential Vout+ can be shortened from time tr1 to time tr2. Therefore, power consumption at the time of the charge pump rise can be reduced. Also, the operation time can be shortened.

Second Embodiment

In the second embodiment, a similar improvement is applied to negative voltage generation circuit 8 of FIG. 1.

Figure 7:
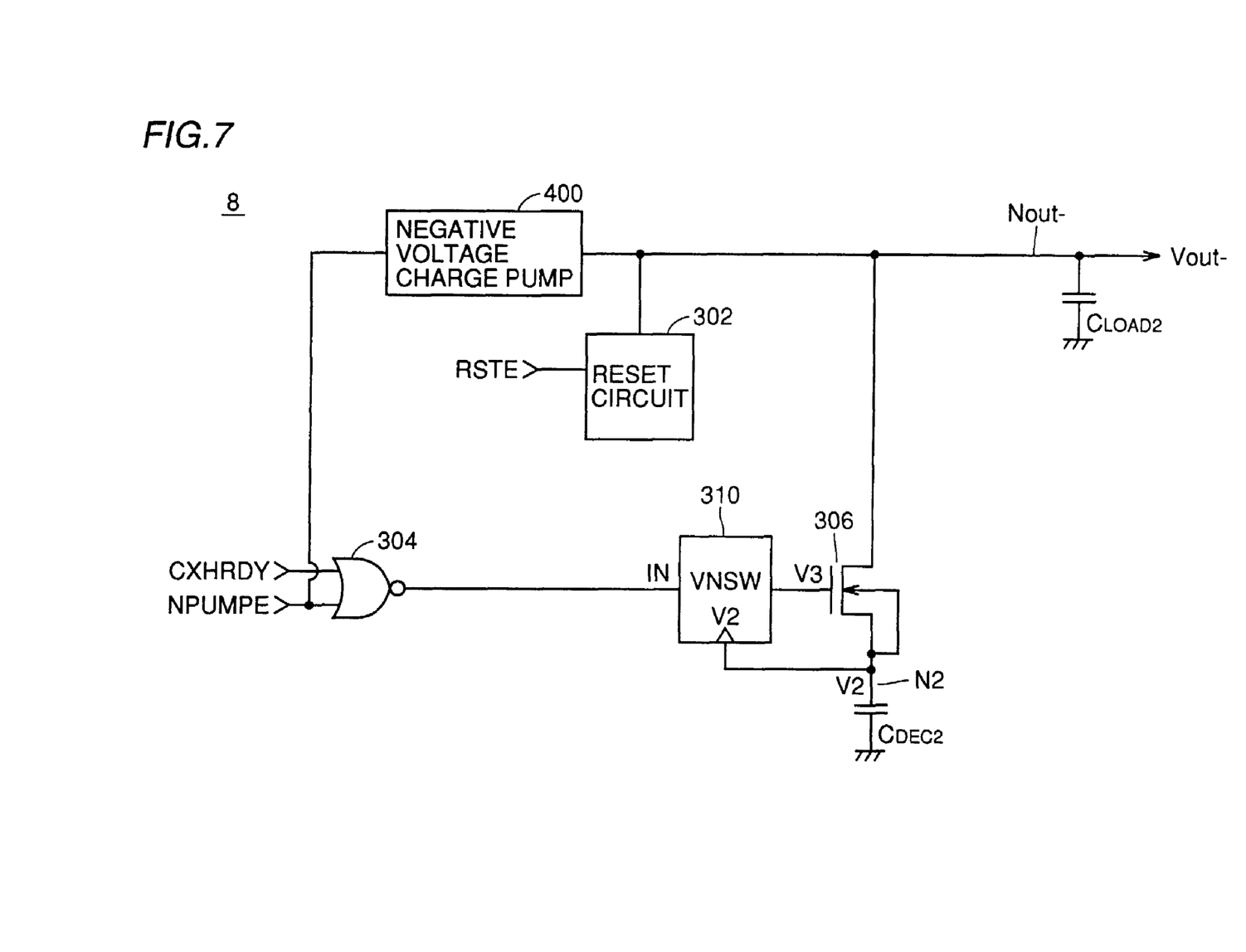
FIG. 7 is a circuit diagram showing a structure of a negative voltage generation circuit 8 of FIG. 1.

FIG. 7 is a circuit diagram showing a structure of negative voltage generation circuit 8 of FIG. 1.

Referring to FIG. 7, negative voltage generation circuit 8 includes an NOR circuit 304 receiving charge pump activation signal NPUMPE and signal CXHRDY, a negative voltage charge pump 400 rendered active by charge pump activation signal NPUMPE to down-convert the potential of node Nout-, a reset circuit 302 rendered active by reset signal RSTE to couple the potential of node Nout- to the ground potential, a level conversion circuit 310 carrying out level conversion according to the output of NOR circuit 304 and a potential V2 of node N2, an N channel MOS transistor 306 connected between nodes Nout- and N2, receiving the output of level conversion circuit 310 at its gate, and having its backgate connected to node N2, and a decouple capacitor $C_{DEC2}$ coupled between node N2 and the ground node. Various circuits are coupled to node Nout- via distributor 14 of FIG. 1. Thus, load capacitance $C_{LOAD2}$ is connected to node Nout-.

Figure 8:
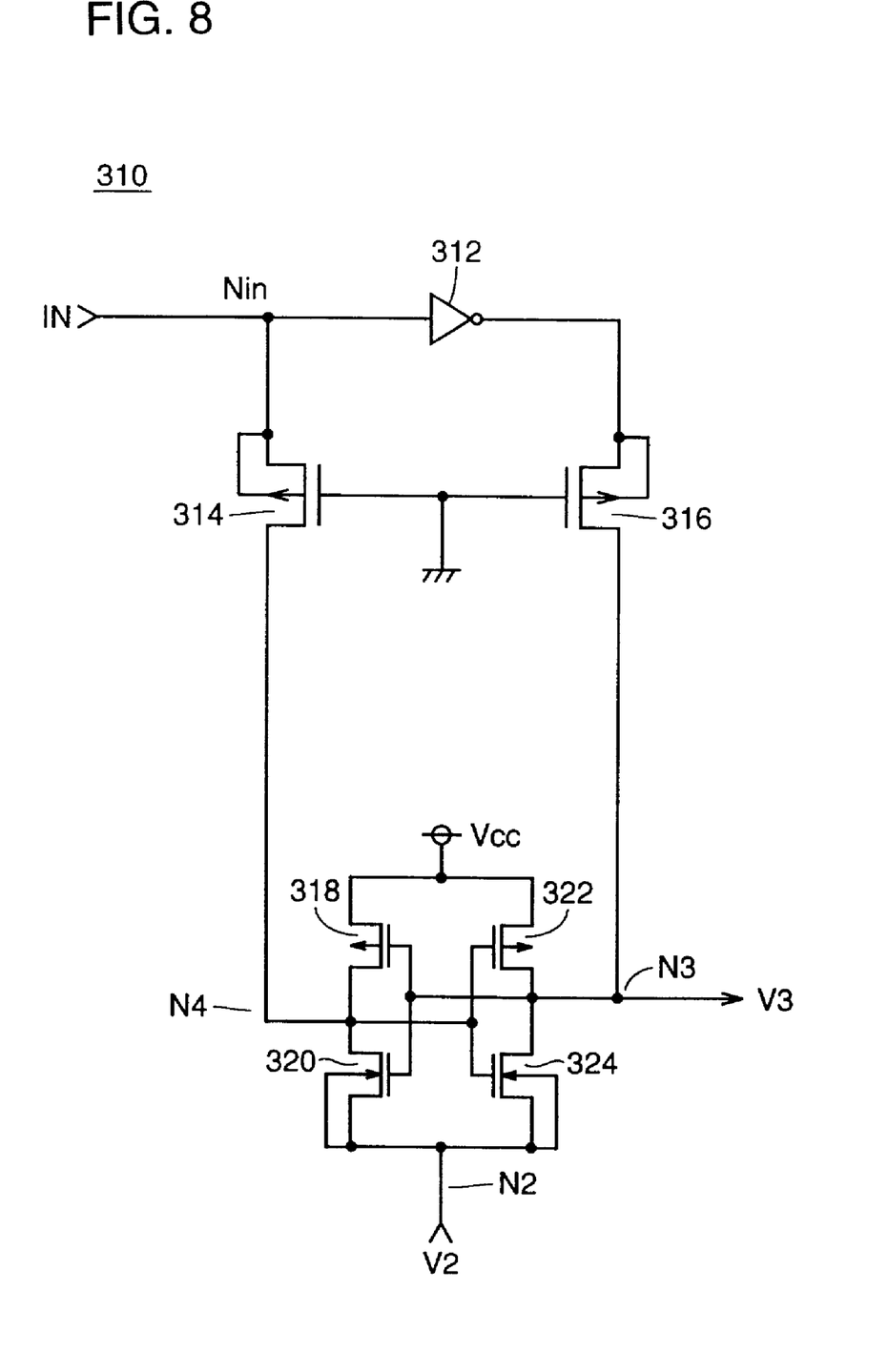
FIG. 8 is a circuit diagram showing a structure of a level conversion circuit 310 of FIG. 7.

FIG. 8 is a circuit diagram showing a structure of level conversion circuit 310 of FIG. 7.

Referring to FIG. 8, level conversion circuit 310 receives an input signal at input node Nin to switch an output potential V3.

Level conversion circuit 310 includes an inverter 312 having its input connected to node Nin, a P channel MOS transistor 314 connected between nodes Nin and N4, having its backgate connected to node Nin and its gate connected to the ground node, a P channel MOS transistor 316 connected between the output node of inverter 312 and node N3, and having its backgate connected to the output node of inverter 312 and its gate connected to the ground node, a P channel MOS transistor 318 connected between the power supply node and node N4, and having its gate connected to node N3, an N channel MOS transistor 320 connected between nodes N4 and N2, and having its gate connected to node N3, a P channel MOS transistor 322 connected between the power supply node and node N3, and having its gate connected to node N4, and an N channel MOS transistor 324 connected between nodes N3 and N4, and having its gate connected to node N4. The potential of node N3 corresponds to output potential V3 of level conversion circuit 310. The backgate of N channel MOS transistor 320 and the backgate of N channel MOS transistor 324 are connected to node N2.

Figure 9:
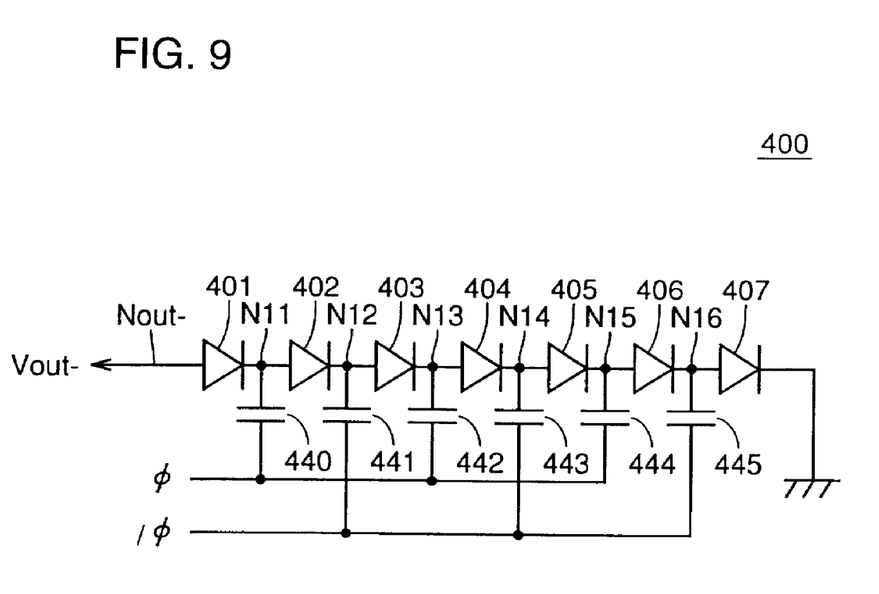
FIG. 9 is a circuit diagram showing a structure of a negative voltage charge pump circuit 400 of FIG. 7.

FIG. 9 is a circuit diagram showing a structure of negative voltage charge pump circuit 400 of FIG. 7.

Although not shown, clock signals φ and /φ are applied to negative voltage charge pump 400 according to activation of charge pump activation signal NPUMPE.

Referring to FIG. 9, negative voltage charge pump circuit 400 includes a diode 401 having its anode connected to node Nout- and its cathode connected to node N11, a diode 402 having its anode and cathode connected to nodes N11 and N12, respectively, a diode 403 having its anode and cathode connected to nodes N12 and N13, respectively, a diode 404 having its anode and cathode connected to nodes N13 and N14, respectively, a diode 405 having its anode and cathode connected to nodes N14 and N15, respectively, a diode 406 having its anode and cathode connected to nodes N15 and N16, respectively, and a diode 407 having its anode connected to node N16 and each cathode coupled to the ground potential.

Node Nout- is the output node of negative voltage charge pump circuit 400. Negative potential Vout- is output from node Nout-.

Negative voltage charge pump circuit 400 further includes a capacitor 440 connected between the clock node to which clock signal φ is applied and node N11, a capacitor 441 connected between the complementary clock node to which complementary clock signal /φ is applied and node N12, a capacitor 442 connected between the clock node and node N13, a capacitor 443 connected between the complementary clock node and node N14, a capacitor 444 connected between the clock node and node N15, and a capacitor 445 connected between the complementary clock node and node N16.

Diode-connected MOSFETs, for example, are employed as diodes 401–407 of FIG. 9.

Figure 10:
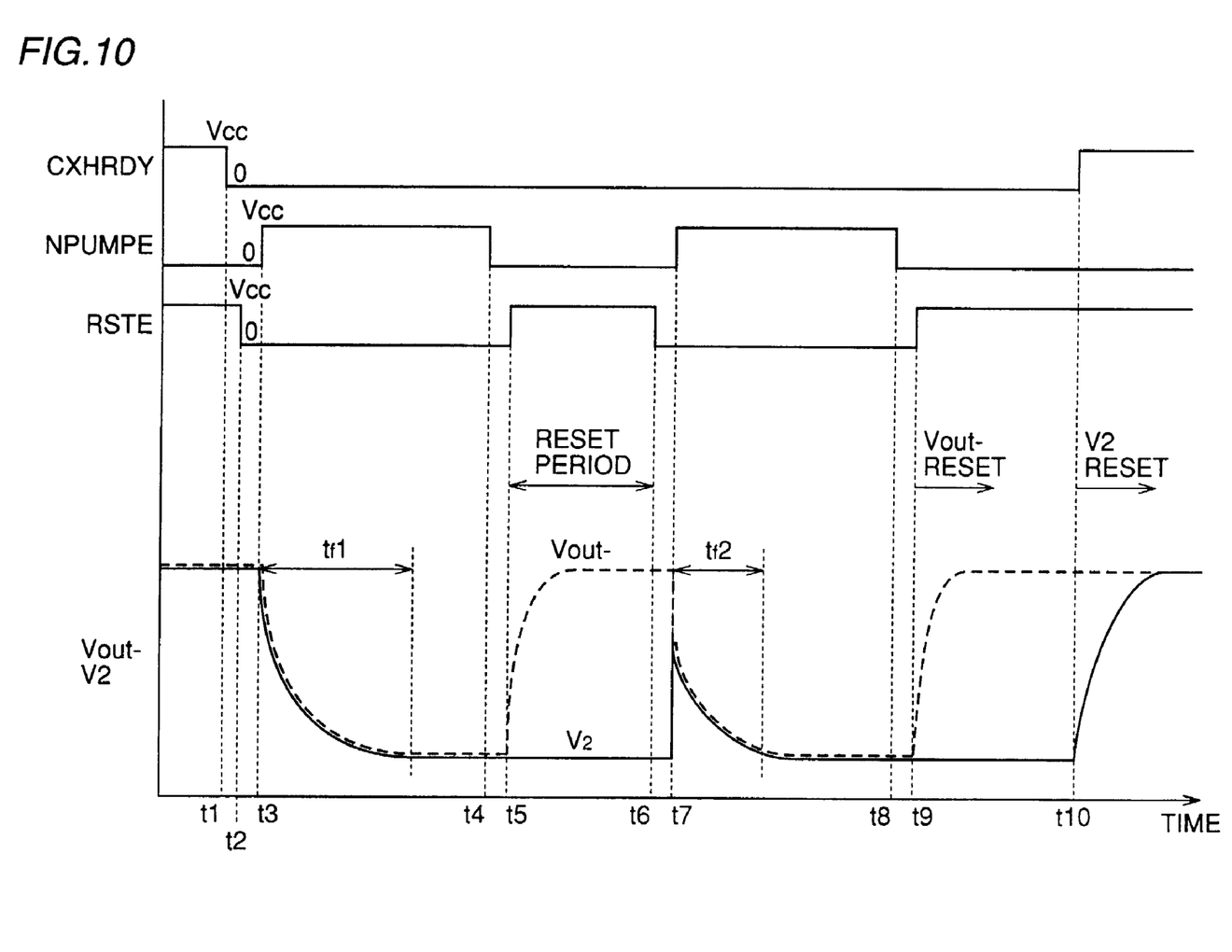
FIG. 10 is an operation waveform diagram to describe an operation of negative voltage generation circuit 8 of FIG. 7.

FIG. 10 is an operation waveform diagram to describe the operation of negative voltage generation circuit 8 of FIG. 7.

At time t1, signal CXHRDY is pulled down to an L level. The semiconductor memory device enters a program.erasure mode from a standby mode. At time t2, reset signal RSTE is pulled down to an L level, whereby reset circuit 302 is rendered inactive. At time t3, charge pump activation signal NPUMPE is pulled up to an H level, whereby negative voltage charge pump 400 is rendered active to generate a high voltage for writing erasure.

Here, N channel MOS transistor 302 is conducting. Therefore, output potential Vout− and potential V2 are down-converted simultaneously.

At time t4, negative voltage charge pump 400 is rendered inactive. At the same time, N channel MOS transistor 306 is rendered nonconductive, whereby decouple capacitor $C_{DEC2}$ is disconnected from reset circuit 302. At time t5, reset signal RSTE rises to an H level, whereby reset circuit 302 is rendered active. During the reset period of time t5–t6, output potential Vout− attains the level of the ground potential which is the reset potential by the function of reset circuit 302. Here, decouple capacitor $C_{DEC2}$ is disconnected from reset circuit 302. Therefore, potential V2 maintains the negative level.

At time t6, reset signal RSTE is pulled down, whereby the reset period ends. At time t7, negative voltage charge pump 400 is rendered active according to the rise of signal NPUMPE. At the same time, N channel MOS transistor 306 is rendered conductive. Decouple capacitor $C_{DEC2}$ is connected to node Nout−. The charge accumulated at decouple capacitor $C_{DEC2}$ is redistributed to load capacitance $C_{LOAD2}$, whereby output potential Vout− is down-converted speedily.

Here, potential V0 of output potential Vout− after redistribution is represented as:

$$V0 = (C_{DEC2}/(C_{DEC2}+C_{LOAD2})) \times V2 \qquad (2)$$

When $C_{DEC2}$=300 pF, $C_{LOAD2}$=300 pF, and V2=−10V, down-conversion is initiated from −5V.

Accordingly, the falling time of output potential Vout− is shortened from time tf1 to time tf2. Power consumption of the negative voltage generation circuit can be reduced. Also, the operation time can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a potential generation circuit applying a predetermined potential to an internal node;
   a switch circuit having one end connected to said internal node, and attaining a conductive state when said potential generation circuit is rendered active, and attaining a nonconductive state when said potential generation circuit is rendered inactive;
   a potential stabilization circuit connected to the other end of said switch circuit, stabilizing a potential of said internal node when said potential generation circuit is rendered active,
   said potential stabilization circuit maintaining said predetermined potential when said potential generation circuit is rendered inactive; and
   a storage unit receiving the potential of said internal node, and carrying out data writing.

2. The semiconductor memory device according to claim 1, wherein said potential stabilization circuit comprises
   a power supply node to which a first power supply potential is applied, and
   a capacitor having one end connected to said power supply node, and the other end connected to said internal node via said switch circuit when said potential generation circuit is rendered active.

3. The semiconductor memory device according to claim 2, wherein said potential generation circuit receives a second power supply potential, rendered active according to an activation signal, and generating said predetermined potential higher than said second power supply potential,
   wherein said switch circuit comprises a P channel MOS transistor connected between said internal node and said other end of said capacitor, and rendered conductive according to said activation signal.

4. The semiconductor memory device according to claim 3, further comprising a level conversion circuit converting a high potential level of said activation signal to a potential of the other end of said capacitor, and providing the converted potential to the gate of said P channel MOS transistor, wherein said P channel MOS transistor has its backgate connected to the other end of said capacitor.

5. The semiconductor memory device according to claim 3, wherein said potential generation circuit comprises a charge pump circuit receiving said second power supply potential and a clock signal to generate said predetermined potential.

6. The semiconductor memory device according to claim 2, wherein said potential generation circuit receives a third power supply potential, rendered active according to an activation signal, and generating said predetermined potential lower than said third power supply potential,
   wherein said switch circuit comprises an N channel MOS transistor connected between said internal node and said other end of said capacitor, and rendered conductive according to said activation signal.

7. The semiconductor memory device according to claim 6, further comprising a level conversion circuit converting a low potential level of said activation signal to a potential of the other end of said capacitor, and providing the converted potential to the gate of said N channel MOS transistor, wherein said N channel MOS transistor has its backgate connected to the other end of said capacitor.

8. The semiconductor memory device according to claim 6, wherein said potential generation circuit includes a charge pump circuit receiving said third power supply potential and a clock signal to generate said predetermined potential.

* * * * *